(12) United States Patent
Kasahara et al.

(10) Patent No.: US 9,698,084 B2
(45) Date of Patent: Jul. 4, 2017

(54) SEMICONDUCTOR DEVICE AND LEAD FRAME HAVING TWO LEADS WELDED TOGETHER

(71) Applicant: SHINKO ELECTRIC INDUSTRIES CO., LTD., Nagano (JP)

(72) Inventors: Tetsuichiro Kasahara, Taipei (TW); Naoya Sakai, Nagano (JP); Hideki Kobayashi, Nagano (JP); Masayuki Okushi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 13 days.

(21) Appl. No.: 14/955,117

(22) Filed: Dec. 1, 2015

(65) Prior Publication Data

US 2016/0181187 A1  Jun. 23, 2016

(30) Foreign Application Priority Data

Dec. 19, 2014 (JP) .................. 2014-257463

(51) Int. Cl.
*H01L 23/495* (2006.01)
*H01L 23/48* (2006.01)
(Continued)

(52) U.S. Cl.
CPC .. *H01L 23/49555* (2013.01); *H01L 23/49537* (2013.01); *H01L 23/49548* (2013.01);
(Continued)

(58) Field of Classification Search
CPC .............. H01L 23/49555; H01L 24/97; H01L 23/49582; H01L 23/49537; H01L 23/49548; H01L 23/3107; H01L 2224/48247; H01L 2924/0002; H01L 2224/48091; H01L 2924/181; H01L 23/48; H01L 23/495; H01L 23/498; H01L 33/62; H01L 2225/06548; H01L 2225/1041; H01L 23/043; H01L 23/3128
(Continued)

(56) References Cited

U.S. PATENT DOCUMENTS

2004/0011699 A1* 1/2004 Park .................. H01L 23/49537
  206/710
2007/0096284 A1* 5/2007 Wallace ............ H01L 23/49506
  257/686

FOREIGN PATENT DOCUMENTS

JP  2003-197845  7/2003

\* cited by examiner

*Primary Examiner* — Kimberly Rizkallah
*Assistant Examiner* — Dilinh Nguyen
(74) *Attorney, Agent, or Firm* — IPUSA, PLLC

(57) ABSTRACT

A semiconductor device includes a lead frame having terminals, a semiconductor chip electrically coupled to the terminals, and a resin part configured to encapsulate the semiconductor chip such as to expose part of the terminals, wherein a given one of the terminals includes a first lead and a second lead welded together such that an upper face of the first lead is placed against a lower face of the second lead, wherein the lower face of the second lead extends further than the upper face of the first lead toward the semiconductor chip in a longitudinal direction of the terminal, and also extends further sideways than the upper face of the first lead in a transverse direction of the terminal, and wherein an area of the lower face of the second lead is covered with the resin part, the area extending further than the upper face of the first lead.

8 Claims, 13 Drawing Sheets

(51) Int. Cl.
    *H01L 23/52*    (2006.01)
    *H01L 29/40*    (2006.01)
    *H01L 23/00*    (2006.01)
    *H01L 23/31*    (2006.01)
(52) U.S. Cl.
    CPC ........ *H01L 23/49582* (2013.01); *H01L 24/97*
        (2013.01); *H01L 23/3107* (2013.01); *H01L
        24/45* (2013.01); *H01L 24/48* (2013.01); *H01L
        2224/45144* (2013.01); *H01L 2224/45147*
        (2013.01); *H01L 2224/48091* (2013.01); *H01L
        2224/48247* (2013.01); *H01L 2224/85424*
        (2013.01); *H01L 2224/85439* (2013.01); *H01L
        2224/85444* (2013.01); *H01L 2224/85447*
        (2013.01); *H01L 2924/00014* (2013.01); *H01L
        2924/181* (2013.01)
(58) Field of Classification Search
    USPC .................. 257/666, 690, 692, 784, 786
    See application file for complete search history.

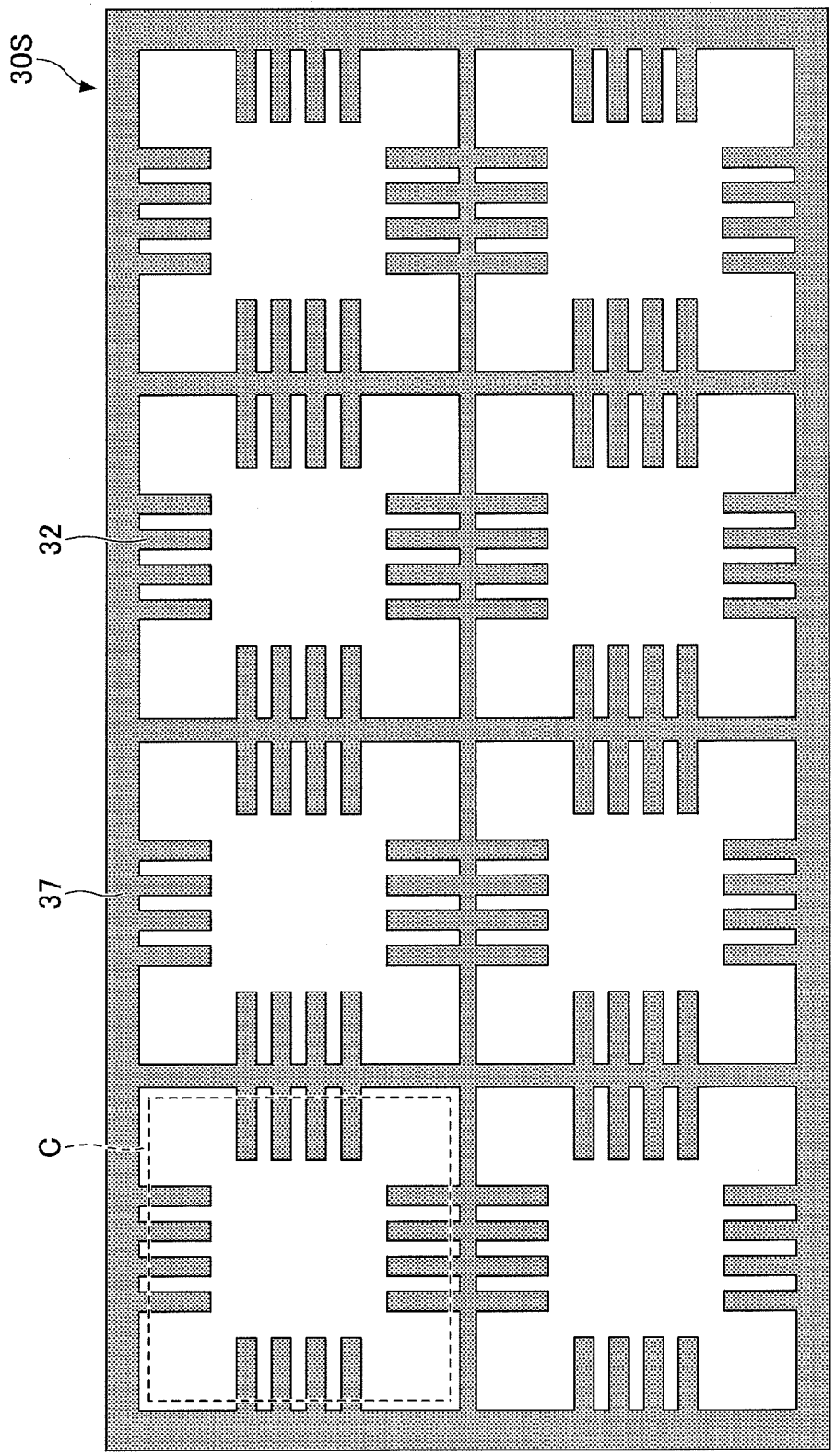

SEMICONDUCTOR DEVICE AND LEAD FRAME HAVING TWO LEADS WELDED TOGETHER

CROSS-REFERENCE TO RELATED APPLICATIONS

The present application is based upon and claims the benefit of priority from the prior Japanese Patent Application No. 2014-257463 filed on Dec. 19, 2014, with the Japanese Patent Office, the entire contents of which are incorporated herein by reference.

FIELD

The disclosures herein relate to a lead frame and a semiconductor device.

BACKGROUND

No-lead-type semiconductor devices such as QFN (i.e., Quad Flat No Lead) packages are known in the art. In QFN-type semiconductor devices, leads (i.e., terminals) made of copper alloy or the like may be formed by half etching.

Half etching advances not only in the depth direction but also in the width direction, which makes it difficult to form fine leads. Such a fact has been hampering the efforts to shorten lead pitches and to increase the number of pins. In consideration of this, an effort has been made to develop a QFN-type semiconductor device in which terminals are formed by laminating two leads, without using half etching.

The above-noted semiconductor device, however, may have a risk of a resin part becoming detached due to insufficient adhesion between terminals formed of two laminated leads and the resin part that encapsulates a portion of the terminals.

Accordingly, there may be a need to provide a semiconductor device which has improved adhesion between terminals and a resin part.

[Patent Document 1] Japanese Laid-open Patent Publication No. 2003-197845

SUMMARY

According to an aspect of the embodiment, a semiconductor device includes a lead frame having terminals, a semiconductor chip electrically coupled to the terminals, and a resin part configured to encapsulate the semiconductor chip such as to expose part of the terminals, wherein a given one of the terminals includes a first lead and a second lead welded together such that an upper face of the first lead is placed against a lower face of the second lead, wherein the lower face of the second lead extends further than the upper face of the first lead toward the semiconductor chip in a longitudinal direction of the given one of the terminals, and also extends further sideways than the upper face of the first lead in a transverse direction of the given one of the terminals, and wherein an area of the lower face of the second lead is covered with the resin part, the area extending further than the upper face of the first lead.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 is a drawing illustrating an example of a process step for making the semiconductor device according to the first embodiment;

DESCRIPTION OF EMBODIMENTS

In the following, embodiments will be described by referring to the accompanying drawings. In these drawings, the same elements are referred to by the same references, and a duplicate description thereof may be omitted.

<First Embodiment>

[Structure of Semiconductor Device of First Embodiment]

Figure 1A:
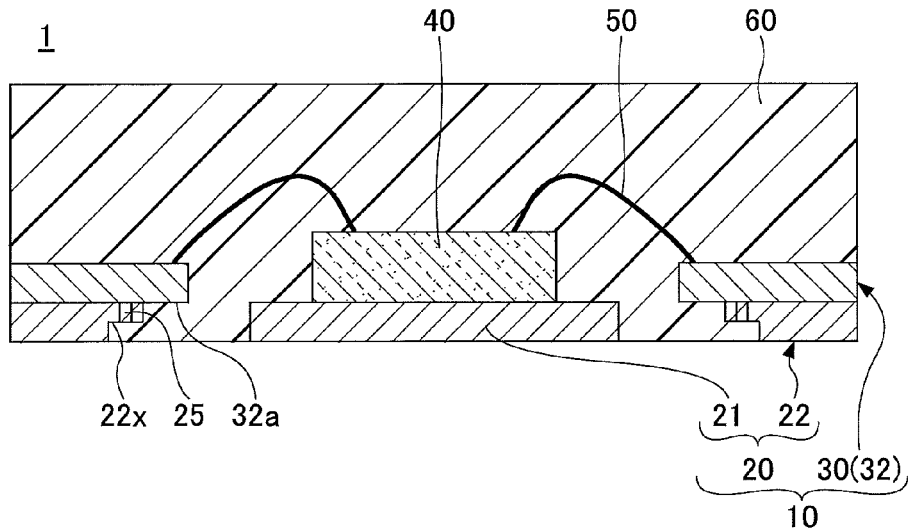
FIGS. 1A and 1B are drawings illustrating an example of a semiconductor device according to a first embodiment.
Figure 1B:
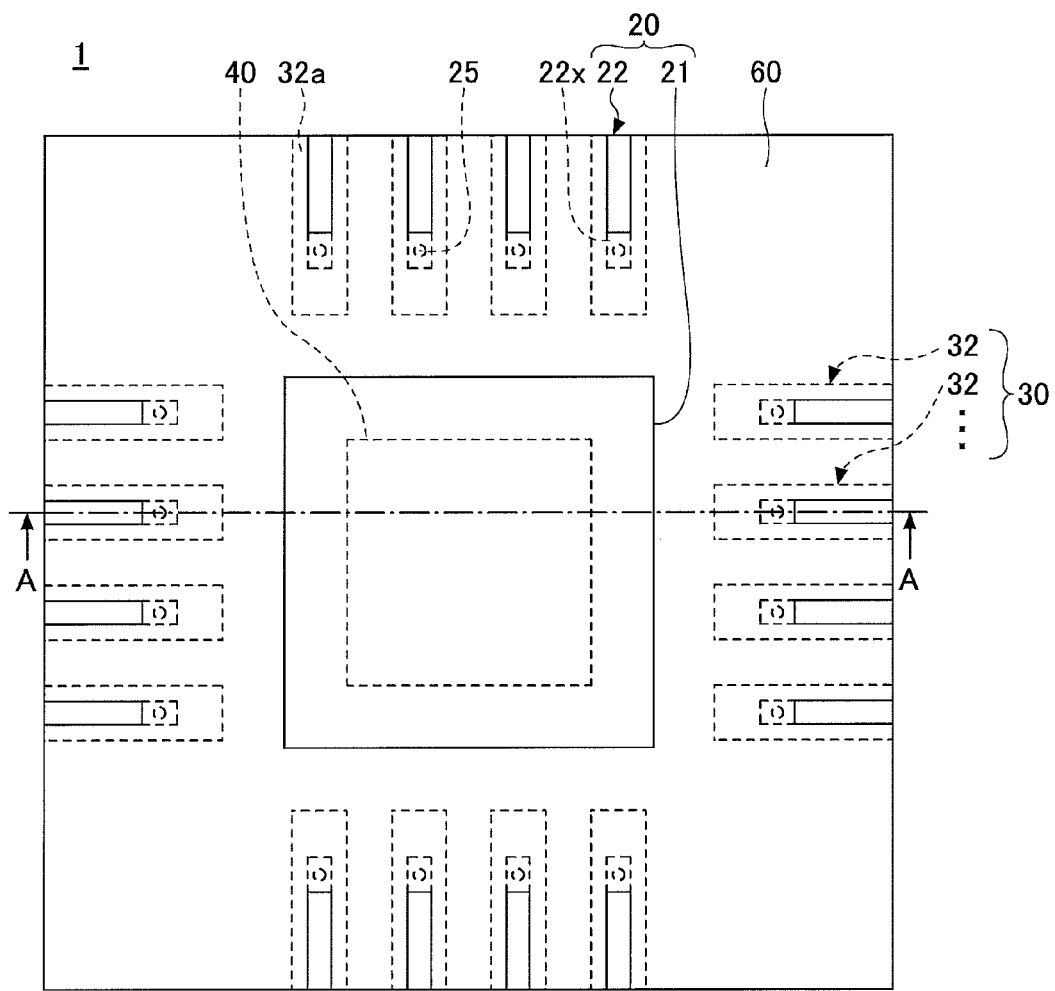
Figure 2A:
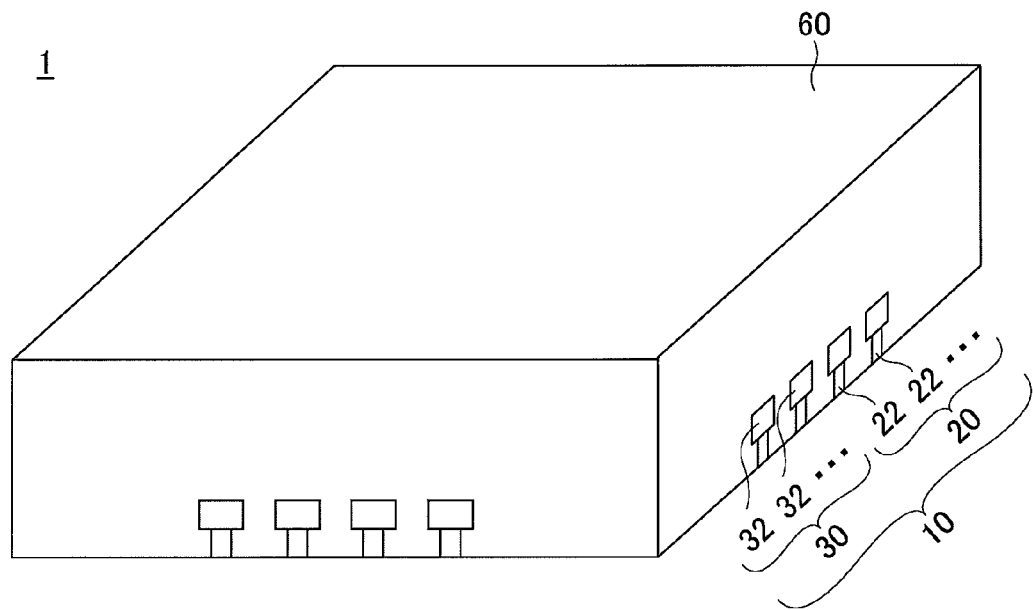
FIGS. 2A through 2C are drawings illustrating the example of the semiconductor device according to the first embodiment.
Figure 2B:
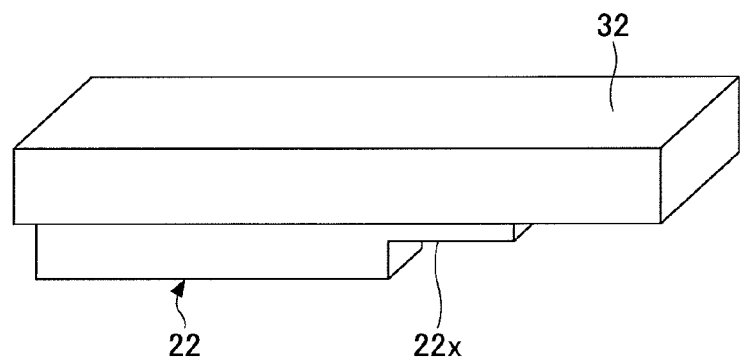
Figure 2C:
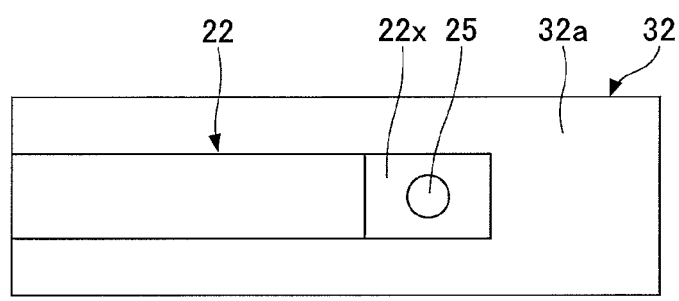

In the following, a description will be first given of the structure of a semiconductor device of a first embodiment. FIGS. 1A and 1B are drawings illustrating an example of the semiconductor device according to the first embodiment. FIG. 1B illustrates a bottom plan view, and FIG. 1A illustrates a cross-sectional view taken along a line A-A in FIG. 1B. FIGS. 2A through 2C are drawings illustrating an example of the semiconductor device according to the first embodiment. FIG. 2A is a perspective view illustrating the entirety of the semiconductor device. FIG. 2B is a perspective view illustrating an upper lead and a lower lead. FIG. 2C is a bottom plan view illustrating the upper lead and the lower lead.

As illustrated in FIGS. 1A and 1B and FIGS. 2A through 2C, the semiconductor device 1 includes a lead frame 10, a semiconductor chip 40, metal lines (bonding wires) 50, and a resin part 60. The semiconductor device 1 is a QFN-type.

In the present embodiment, for the sake of convenience, the side toward which a second frame 30 is situated relative to a first frame 20 is referred to as an upper side or a first side, and the side toward which the first frame 20 is situated relative to the second frame 30 is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction perpendicular to the first surface of the first frame 20, and a planar shape refers to the shape of an object as viewed in the direction perpendicular to the first surface of the first frame 20.

In the semiconductor device 1, the lead frame 10 is structured such that the lower face of the second frame 30 is welded onto the upper face of the first frame 20. The first frame 20 includes a chip mount section (i.e., die pad) 21 on which a semiconductor chip is mounted, and further includes a plurality of lower leads (first leads) 22. The material of the first frame 20 may be copper (Cu), copper alloy, 42 alloy (i.e., an alloy of Fe and Ni) or the like.

The lower leads 22 are electrically isolated from the chip mount section 21, and are arranged around the chip mount section 21 at a constant pitch in a plan view. It may be noted that the lower leads 22 may not be disposed all around the chip mount section 21, and may be disposed only on two opposite sides of the chip mount section 21. The width of the lower leads 22 may approximately be 0.2 mm, for example. The pitch of the lower leads 22 may approximately be 0.4 mm, for example.

The lower face of each of the lower leads has a step portion 22x situated toward the semiconductor chip 40 (i.e., situated at the end closer to the chip mount section 21 in the longitudinal direction of the lead). In other words, the end of each of the lower leads 22 situated toward the semiconductor chip 40 is longer on the upper side than on the lower side. The thickness of the lower leads 22 at other points than the step portion 22x may approximately be 75 to 100 micrometers, for example. The thickness of the step portion 22x may approximately be half the thickness of the lower leads 22 measured at other points than the step portion 22x.

The second frame 30 includes a plurality of upper leads (second leads) 32 that are coupled to the metal lines 50. The upper leads 32 are situated such as to overlap the lower leads 22, respectively, in a plan view. Aluminum (Al), aluminum alloy, copper (Cu), copper alloy, 42 alloy or the like may be used as the material of the second frame 30. The thickness of the upper leads 32 may approximately be 75 to 100 micrometers, for example. It may be noted that the second frame 30 does not exist on the chip mount section 21.

In respect of each of the upper leads 32, the area size of the upper face is approximately equal to the area size of the lower face. In respect of each of the lower leads 22, the area size of the upper face is approximately equal to the area size of the lower face (including the lower face of the step portion 22x). In the longitudinal direction of a lower lead 22 and an upper lead 32, the lower face of the upper lead 32 extends further toward the semiconductor chip 40 than the upper face of the lower lead 22. In the transverse direction of a lower lead 22 and an upper lead 32, the lower face of the upper lead 32 extends further sideways than the upper face of the lower lead 22.

In other words, as illustrated in FIG. 2C, the area size of the lower face of the upper lead 32 is larger than the area size of the upper face of the lower lead 22. A periphery portion 32a of the lower face of the upper lead 32 is exposed around the lower lead 22 in a bottom plan view, except for the end thereof that is exposed from a lateral face of the resin part 60. The periphery portion 32a is an area of the lower face of the upper lead 32 that extends further than the upper face of the lower lead 22. The periphery portion 32a is covered with the resin part 60.

The lower lead 22 and the upper lead 32 are bonded to each other by a joint part 25 that is formed on the step portion 22x of the lower lead 22. Specifically, the joint part 25 is formed by melting a portion of the step portion 22x of the lower lead 22 for bonding to the upper lead 32. In other areas than the joint part 25, the lower lead 22 and the upper lead 32 are simply in contact with each other without bonding. The step portion 22x is covered with the resin part 60.

In FIGS. 1A and 1B and FIGS. 2A through 2C, the joint part 25 is illustrated as a portion distinct from the lower leads 22. Nonetheless, the joint part 25 is simply a portion of the lower leads 22 that is locally melted, and is made of the same material and continuous with the lower leads 22. The entirety of a lower lead 22 and an upper lead 32 laminated together may be referred to as a terminal. Namely, the terminal is formed by placing the lower face of the upper lead 32 on the upper face of the lower lead 22 and welding them together.

The semiconductor chip 40 is mounted with its face up on the chip mount section 21 of the first frame 20. Electrode terminals formed on the upper face of the semiconductor chip 40 are electrically coupled to the upper leads 32 of the second frame 30, respectively, through the metal lines 50 that are made of gold, copper or the like. The shorter the metal lines 50, the more preferable in terms of cost. Because of this, an end of each of the metal lines 50 may be connected to an area of the upper lead 32 that does not overlap the lower lead 22 in a plan view.

The resin part 60 encapsulates the first frame 20, the second frame 30, the semiconductor chip 40 and the metal lines 50. It may be noted that the lower face of the chip mount section 21, the lower faces of the lower leads 22 excluding the step portion 22x, and the end faces of both the lower leads 22 and the upper leads 32 on the perimeter of the semiconductor device 1 are exposed from the resin part 60. Namely, the resin part 60 encapsulates the semiconductor chip 40 and the like such as to expose part of the terminals.

The lower face of the chip mount section and the lower faces of the lower leads 22 excluding the step portion 22x may be flush with the lower face of the resin part 60. The end faces of both the lower leads 22 and the upper leads 32 on the perimeter of the semiconductor device 1 may be flush with the lateral faces of the resin part 60. The resin part 60 may be made of molded resin or the like that is an epoxy resin inclusive of fillers, for example.

[Method of Making Semiconductor Device of First Embodiment]

In the following, a description will be given of a method of making a semiconductor device according to the first embodiment. FIG. 3 through FIGS. 6A to 6C are drawings illustrating examples of process steps for making a semiconductor device according to the first embodiment.

Figure 3:
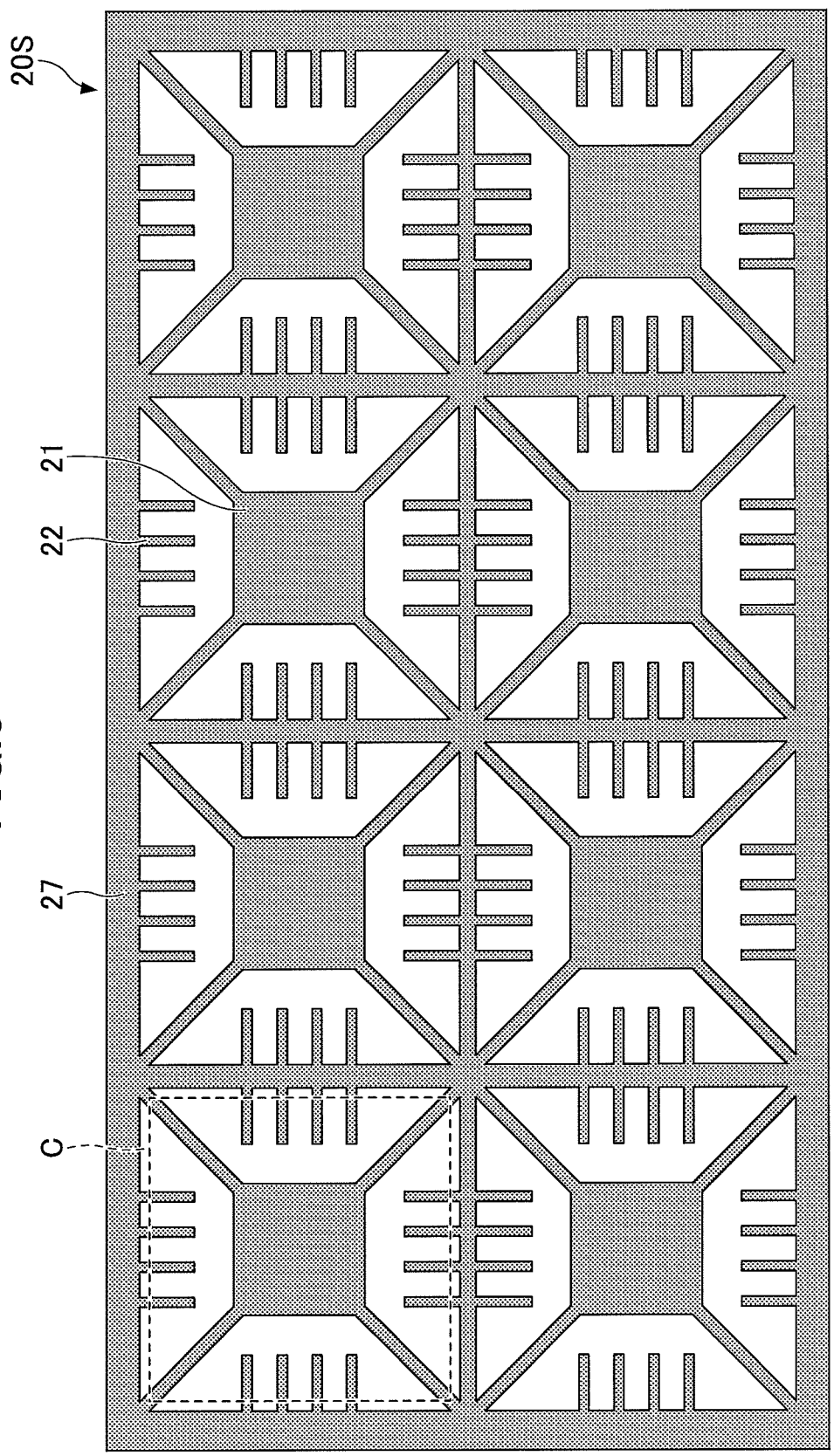
FIG. 3 is a drawing illustrating an example of a process step for making the semiconductor device according to the first embodiment.

In the process step illustrated in FIG. 3, a first frame 20S is formed by performing stamping, etching or the like on a thin metal plate. The material of the first frame 20S may be copper (Cu), copper alloy, 42 alloy or the like. The thickness of the first frame 20S may approximately be 75 to 100 micrometers, for example. In FIG. 3, the first frame 20S is illustrated in halftone, for the sake of convenience.

The structure of the first frame 20S is such that a frame part 27 connects together a plurality of areas C (each of which will hereinafter be referred to as a discrete separation area C), the number of which is eight in the example illustrated in FIG. 3. The discrete separation area C includes the chip mount section 21 and the lower leads 22. In the end, the first frame 20S is cut along the cut lines illustrated by dashed lines into discrete separation areas C, each of which serves as the first frame 20 (see FIGS. 1A and 1B, for example). In the case of the first frame 20S being formed by stamping or etching, performing a cleaning step after the stamping or etching step may be preferred.

In the process step illustrated in FIG. 4, a second frame 30S is formed by performing stamping, etching or the like on a thin metal plate. Aluminum (Al), aluminum alloy, copper (Cu), copper alloy, 42 alloy or the like may be used as the material of the second frame 30S. The thickness of the second frame 30S may approximately be 75 to 100 micrometers, for example. In FIG. 4, the second frame 30S is illustrated in halftone, for the sake of convenience.

The structure of the second frame 30S is such that a frame part 37 connects together a plurality of areas C (each of which will hereinafter be referred to as a discrete separation area C), the number of which is eight in the example illustrated in FIG. 4. The discrete separation area C includes the upper leads 32. In the end, the second frame 30S is cut along the cut lines illustrated by dashed lines into discrete separation areas C, each of which serves as the second frame 30 (see FIGS. 1A and 1B, for example). In the case of the second frame 30S being formed by stamping or etching, performing a cleaning step after the stamping or etching step may be preferred. Subsequent process steps will hereinafter be described by referring to cross-sectional views illustrating a discrete separation area C illustrated in FIG. 3 and FIG. 4.

Figure 5A:
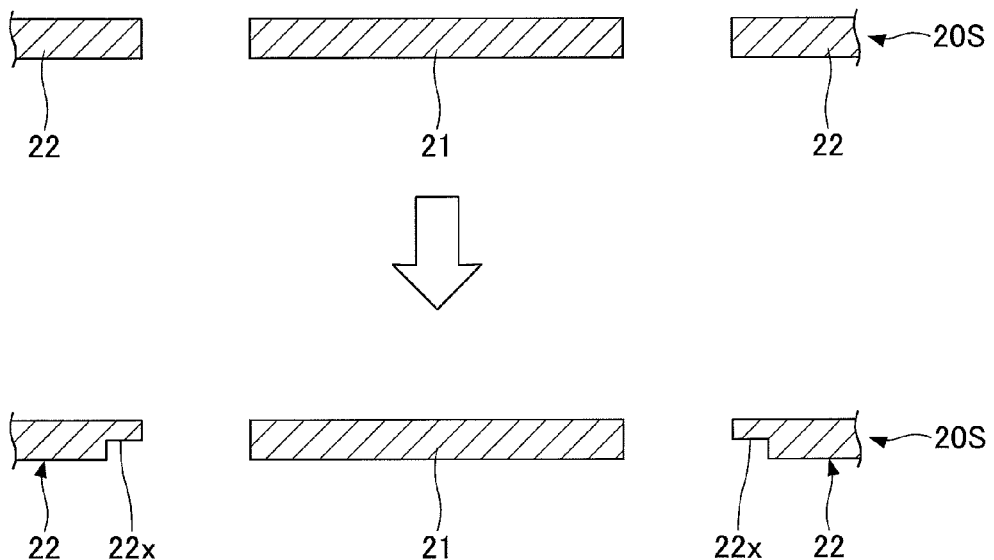
FIGS. 5A through 5C are drawings illustrating an example of process steps for making the semiconductor device according to the first embodiment.

In the process step illustrated in FIG. 5A, the first frame 20S made in the process step illustrated in FIG. 3 is processed to form the step portion 22x in the lower face of each of the lower leads 22 at the inner end thereof (i.e., the end situated toward the chip mount section 21 in the longitudinal direction of the lead). The thickness of the step portion 22x may approximately be half the thickness of the lower leads 22 at other points than the step portion 22x. The step portion 22x may be formed by wet etching, for example. Depending on the depth of the step portion 22x, however, the metal plate may be pressed in the process step illustrated in FIG. 3 such as to form the step portion 22x together with the chip mount section 21 and the lower leads 22. In such a case, the process step illustrated in FIG. 5A is not necessary.

Figure 5B:
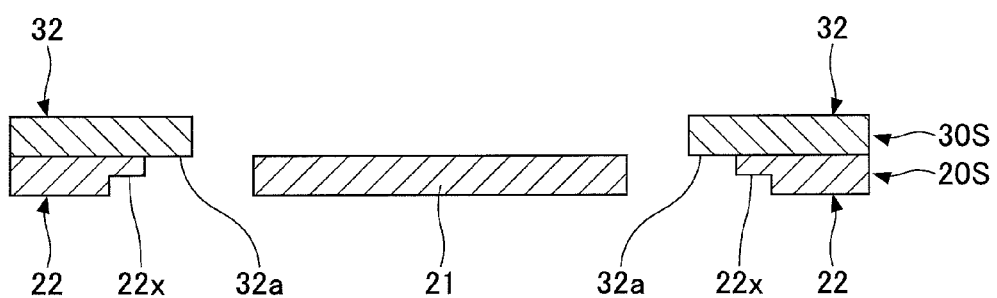

In the process step illustrated in FIG. 5B, the lower face of the second frame 30S made in the process step illustrated in FIG. 4 is placed against the upper face of the first frame 20S having the step portions 22x formed thereon. Since the area size of the lower face of a given upper lead 32 is larger than the area size of the upper face of a corresponding lower lead 22, the periphery portion 32a of the lower face of the upper lead 32 is exposed around the lower lead 22 in a bottom plan view, except where the perimeter of the discrete separation area C is positioned (see FIG. 2C). The periphery portion 32a is an area of the lower face of the upper lead 32 that extends further than the upper face of the lower lead 22.

Figure 5C:
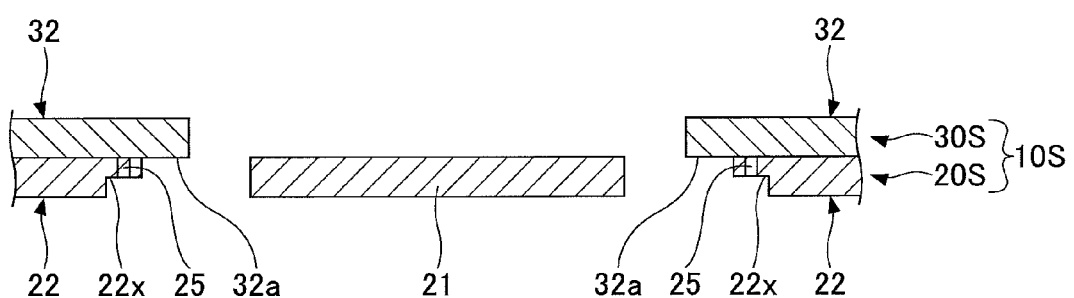

In the process step illustrated in FIG. 5C, the lower leads 22 of the first frame 20S and the upper leads 32 of the second frame 30S are bonded together through the joint parts 25. Specifically, laser welding is performed with respect to the step portion 22x to locally melt the metal material of the lower leads 22 to form the joint parts 25 and to bond the lower leads 22 and the upper leads 32 to each other. With this arrangement, terminals are formed, having the configuration in which the lower faces of the upper leads 32 and the upper faces of the lower leads 22 are placed against each other and welded together. Green laser light formed by utilizing second harmonic generation (SHG) may be used, for example. In this case, the wavelength of laser light may approximately be 532 nm, for example.

The process steps described above are used to make a lead frame 10S having the first frame 20S and the second frame 30S. The lead frame 10S is cut in the end along the cut lines illustrated by the dashed lines in FIG. 3 and FIG. 4 into a plurality of discrete separation areas C, each of which serves as the lead frame 10 (see FIGS. 1A and 1B, for example).

Figure 6A:
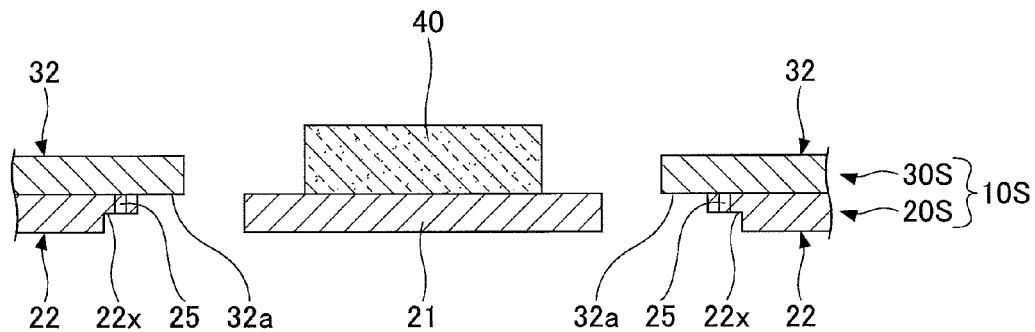
FIGS. 6A through 6C are drawings illustrating an example of process steps for making the semiconductor device according to the first embodiment.

In the process step illustrated in FIG. 6A, the semiconductor chip 40 is mounted with its face up on the chip mount section 21 of the first frame 20S. The semiconductor chip 40 may be mounted on the chip mount section 21 via a die attach film, for example.

Figure 6B:
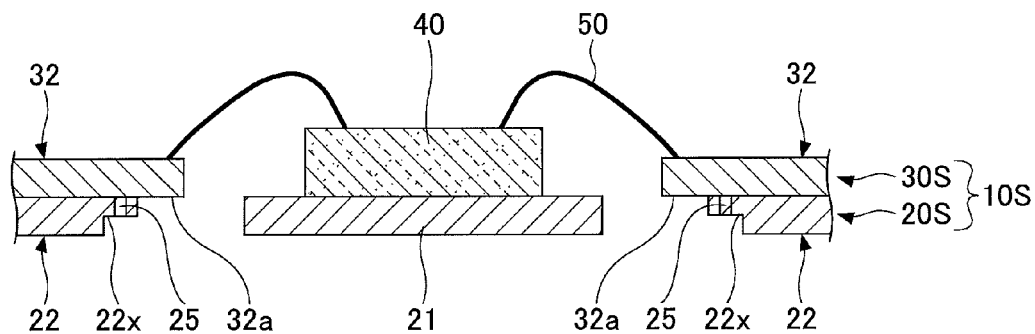

In the process step illustrated in FIG. 6B, electrode terminals formed on the upper face of the semiconductor chip 40 are electrically coupled to the upper leads 32 through the metal lines 50. The metal lines 50 may be wire bonding that connects between the electrode terminals of the semiconductor chip 40 and the upper leads 32.

Figure 6C:
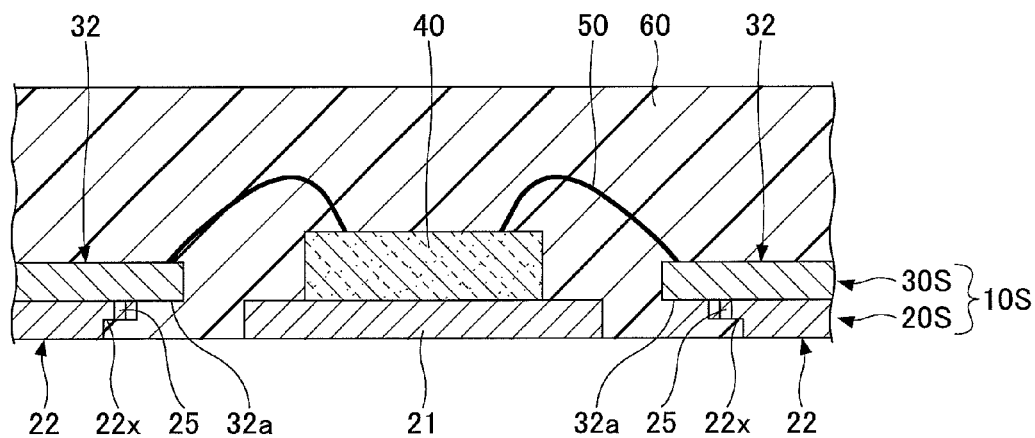

In the process step illustrated in FIG. 6C, the resin part 60 is formed that encapsulates the first frame 20S, the second frame 30S, the semiconductor chip 40 and the metal lines 50. The resin part 60 may be made of molded resin or the like that is an epoxy resin inclusive of fillers, for example. The resin part 60 maybe formed by use of a transfer mold method or a compression mold method or the like.

Subsequently, the structure illustrated in FIG. 6C is cut along the cut lines illustrated by the dashed lines in FIG. 3 and FIG. 4 into individual discrete separation areas C, thereby producing a plurality of semiconductor devices 1 (see FIGS. 1A and 1B). Cutting may be performed by use of a slicer or the like. Dam bars, i.e., the frame part 27 of the first frame 20S and the frame part 37 of the second frame 30S, may be cut along the cut lines at the same time.

Both the frame part 27 and the frame part 37 are positioned outside the cut lines and cut off at the same time as the making of discrete separation areas, which ensures an efficient production step. Because of the use of such a production method, the end faces of the lower leads 22 and the upper leads 32 are exposed on the lateral faces of the resin part 60.

The production steps for providing the semiconductor device 1 as a separate product has been described heretofore. Alternatively, the lead frame 10S illustrated in FIG. 5C prior to separation into discrete pieces may be provided as one product. In this case, one who has obtained the lead frame 10S prior to separation into discrete pieces performs the process steps illustrated in FIG. 6A and onward to make a plurality of semiconductor devices 1.

The first embodiment described above produces the lower leads 22 and the upper leads 32 separately from each other, and bonds them together through strong bonds by use of the joint parts 25 that are formed by laser welding or the like, thereby forming terminals. Provision is made such that the lower leads 22 are smaller (i.e., have a smaller area size) than the upper leads 32 in a plan view. As a result, the lower face of a given upper lead 32 of a terminal extends to expose the periphery portion 32a around the lower lead 22, except for the end thereof exposed from the lateral face of the resin part 60. With this arrangement, the resin material of the resin part 60 holds the periphery portion 32a, which provides an anchoring function between the periphery portion 32a and the resin part 60, thereby providing strong adhesion between the terminals and the resin part 60. Separation of resin constituting the resin part 60 and disconnection of terminals are thus prevented.

Further, the step portion 22x formed in the lower leads 22 is covered with the resin part 60, and is thus not exposed to the outside of the semiconductor device 1. Namely, the resin material of the resin part 60 also holds the step portion 22x, which provides an anchoring function also between the step portion 22x and the resin part 60, thereby providing yet stronger adhesion between the terminals and the resin part 60. Separation of resin constituting the resin part 60 and disconnection of the lower leads 22 are thus prevented.

Moreover, at least the lateral faces of the lower leads 22 are treated to have surface roughness, which further improves adhesion between the lower leads 22 and the resin part 60, thereby preventing the lower leads 22 from being disconnected. Similarly, at least the lateral faces of the chip mount section (die pad) 21 may be treated to have surface roughness.

In place of half etching that tends to be performed with low precision, a press process that enables a high precision process at low cost is used to produce the lower leads 22 and the upper leads 32 separately from each other, followed by laminating the lower leads 22 and the upper leads 32 together to form the terminals. This arrangement enables the miniaturization of terminals, thereby achieving shorter pitches and an increased number of terminals. Process cost is also reduced compared with the case in which half etching is used.

Use of different metal materials for the lower leads 22 and the upper leads 32 may provide advantages utilizing the characteristic properties of different metal materials. For example, use of copper (Cu) for the lower leads 22 enables the use of solder plating, and use of aluminum (Al) for the upper leads 32 allows the areas for wire bonding to require no plating.

<Variation of First Embodiment>

This variation of the first embodiment is directed to an example in which plating is performed on part of the lead frame. In connection with the variation of the first embodiment, a description of the same or similar constituent elements as those of the previously provided descriptions may be omitted as appropriate.

Figure 7A:
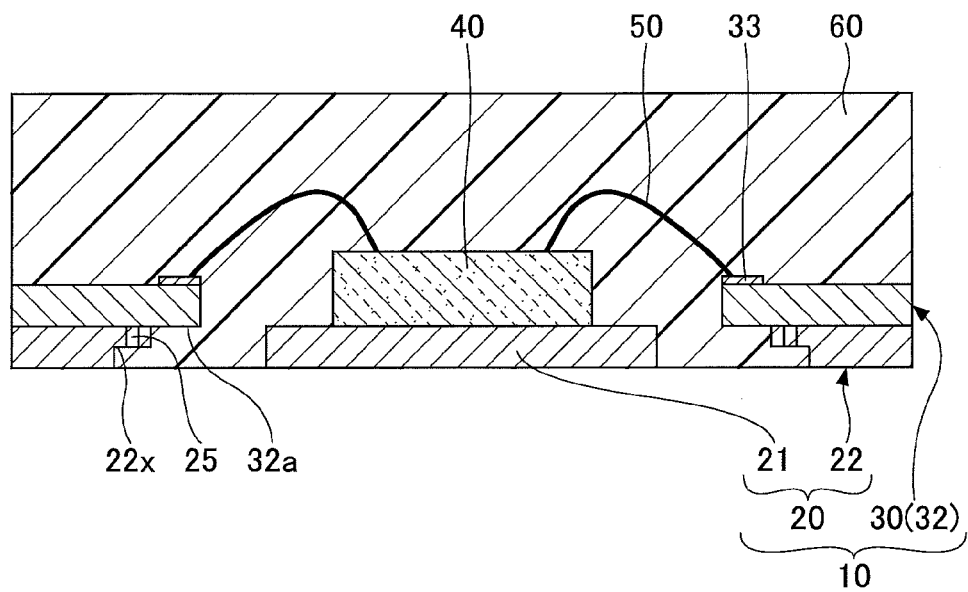
FIGS. 7A and 7B are cross-sectional views illustrating examples of a semiconductor device according to the variation of the first embodiment.
Figure 7B:
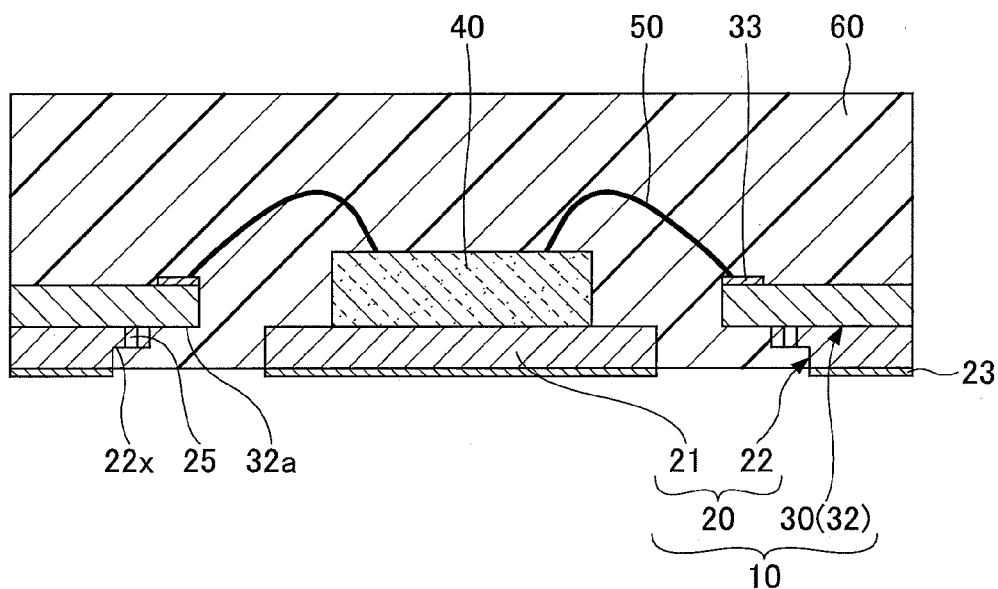

FIGS. 7A and 7B are cross-sectional views illustrating examples of a semiconductor device according to the variation of the first embodiment. In a semiconductor device 1A illustrated in FIG. 7A, the areas of the upper leads 32 of the second frame 30 that are to be connected to the metal lines 50 have a plating film 33 formed thereon. In the case of the upper leads 32 being made of aluminum (Al) or aluminum alloy, sufficiently sturdy bonding is made without forming a plating film. In the case of the upper leads 32 being made of copper (Cu), copper alloy, 42 alloy or the like, however, direct bonding may be difficult. Use of the plating film 33 in such a case enables the provision of sufficiently sturdy bonding.

The plating film 33 may be an Au film, an Ag film, an Ni/Au film (i.e., a metal film formed by laminating an Ni film and an Au film in this order), an Ni/Pd/Au film (i.e., a metal film formed by laminating an Ni film, a Pd film and an Au film in this order), or the like. The thickness of the plating film 33 may approximately be 0.1 to a few micrometers, for example. The plating film 33 may be formed by use of the electroplating method, for example. It may be noted that a treatment to make the upper faces of the upper leads 32 into surfaces with roughness may be applied prior to forming the plating film 33 according to need. Making the upper faces of the upper leads 32 into surfaces with roughness serves to improve adhesion between the upper faces of the upper leads 32 and the plating film 33.

In a semiconductor device 1B illustrated in FIG. 7B, the lower face of the chip mount section 21 and the lower faces of the lower leads 22 of the first frame 20 exposed from the resin part 60 have a plating film 23 formed thereon, in addition to the plating film 33. The provision of the plating film 23 enables sufficient bonding when the semiconductor device 1B is connected to a printed circuit board or the like. The material of and method of making the plating film 23 may be the same or similar to those of the plating film 33.

In the manner as described above, plating films may be formed on some faces of the lower leads 22 and the upper leads 32 according to need. Other advantages of the semiconductor devices 1A and 1B are the same or similar to those of the first embodiment.

<Second Embodiment>

The second embodiment is directed to an example in which a joint part is formed also in the upper leads. In connection with the second embodiment, a description of the same or similar constituent elements as those of the previously provided descriptions may be omitted as appropriate.

Figure 8A:
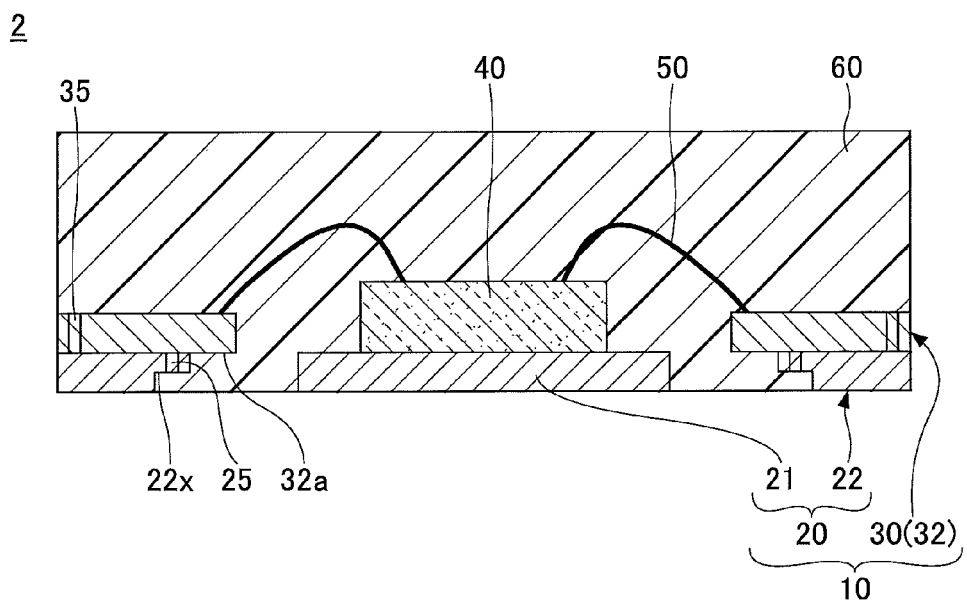
FIGS. 8A through 8C are drawings illustrating an example of a semiconductor device according to a second embodiment.
Figure 8B:
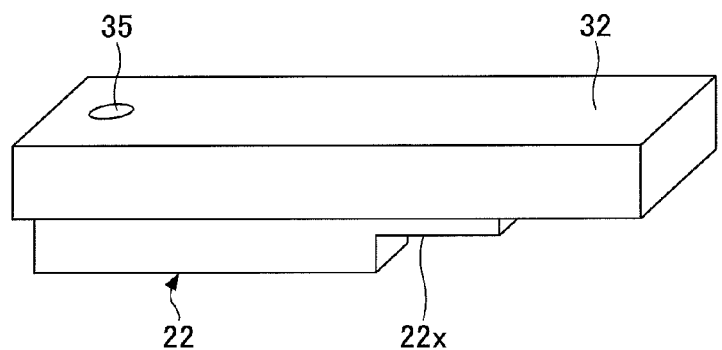
Figure 8C:
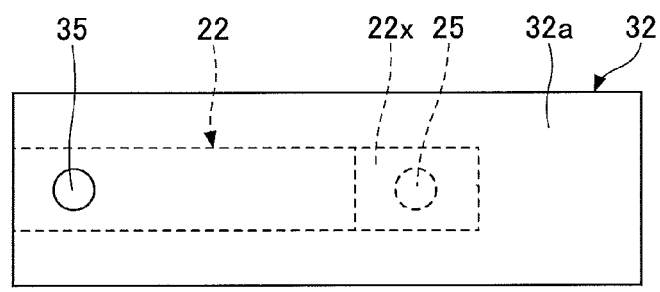

FIGS. 8A through 8C are drawings illustrating an example of a semiconductor device according to the second embodiment. FIG. 8A is a cross-sectional view illustrating the entirety of the semiconductor device. FIG. 8B is a perspective view illustrating an upper lead and a lower lead. FIG. 8C is a plan view illustrating the upper lead and the lower lead.

By referring to FIGS. 8A through 8C, the semiconductor device 2 is configured like the semiconductor device 1 such that the lower face of each of the lower leads 22 has a step portion 22x formed at the inner end (i.e., situated at the end closer to the chip mount section 21 in the longitudinal direction of the lead). Further, the lower leads 22 and the upper leads 32 are bonded together through the joint parts 25 formed in the lower leads 22. In addition, the semiconductor device 2 differs from the semiconductor device 1 in that a second joint part 35 is formed in each of the upper leads 32 at a position toward the outer end thereof (i.e., toward the end farther away from the chip mount section 21 in the longitudinal direction of the lead), and serves to bond the lower leads 22 and the upper leads 32 together.

The second joint part 35 may be formed by laser welding similarly to the joint part 25. In FIGS. 8A through 8C, the second joint part 35 is illustrated as a portion distinct from the upper leads 32. However, the second joint part 35 is merely a portion of the upper leads 32 that is locally melted, and has the same material as, and is continuous with, the upper leads 32.

In the manner as described above, the lower leads 22 and the upper leads 32 are bonded together through the joint part 25 situated close to the inner end (i.e., the end closer to the chip mount section 21 in the longitudinal direction of the lead) and also through the second joint part 35 situated close to the outer end (i.e., the end farther away from the chip mount section 21 in the longitudinal direction of the lead). This arrangement enables sturdy bonding between the lower leads 22 and the upper leads 32 at the points close to the perimeter lateral faces of the semiconductor device 2. This arrangement thus effectively suppresses the risk of having water or the like intruding into the interface between the lower leads 22 and the upper leads 32 from the side exposed to the perimeter lateral faces of the semiconductor device 2. Other advantages are the same as or similar to those of the first embodiment.

<Third Embodiment>

The third embodiment is directed to an example in which a step portion is formed in the upper leads, and has a joint part formed therein. In connection with the third embodiment, a description of the same or similar constituent elements as those of the previously provided descriptions may be omitted as appropriate.

Figure 9A:
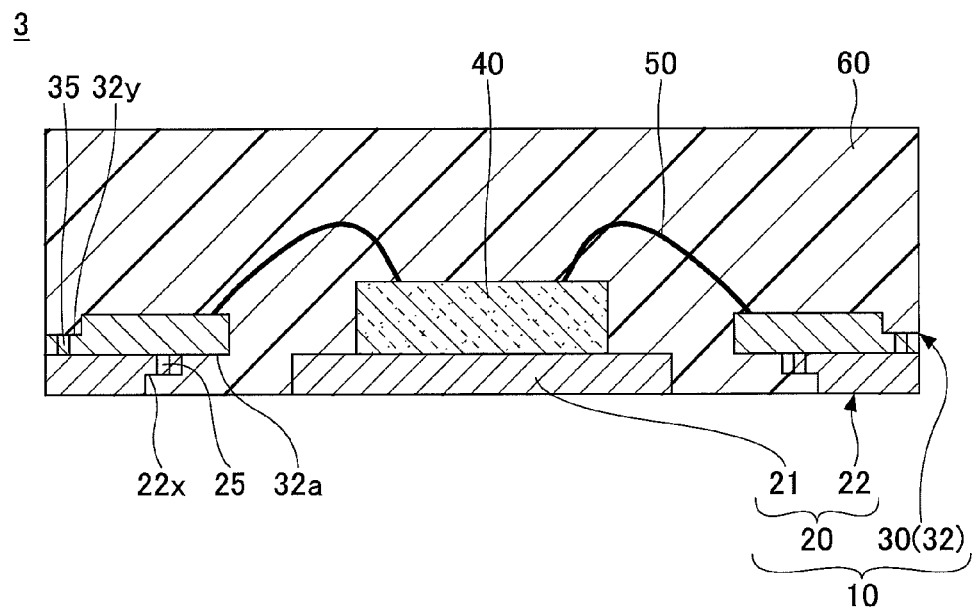
FIGS. 9A through 9C are drawings illustrating an example of a semiconductor device according to a third embodiment.
Figure 9B:
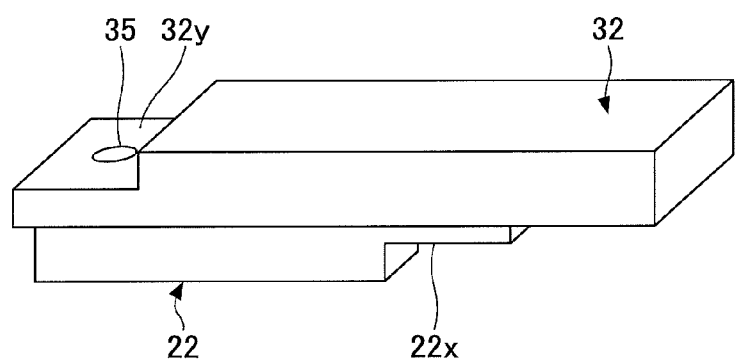
Figure 9C:
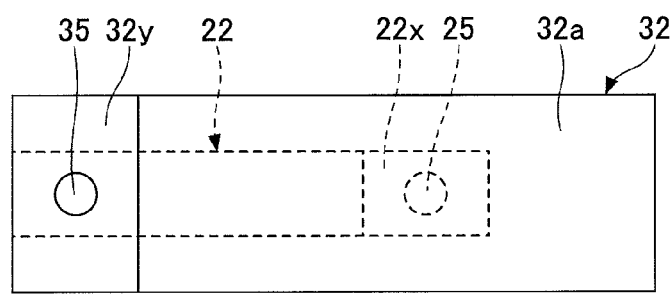

FIGS. 9A through 9C are drawings illustrating an example of a semiconductor device according to the third embodiment. FIG. 9A is a cross-sectional view illustrating the entirety of the semiconductor device. FIG. 9B is a perspective view illustrating an upper lead and a lower lead. FIG. 9C is a plan view illustrating the upper lead and the lower lead.

By referring to FIGS. 9A through 9C, the semiconductor device 3 is configured like the semiconductor device 1 such that the lower face of each of the lower leads 22 has a step portion 22x formed at the inner end (i.e., situated at the end closer to the chip mount section 21 in the longitudinal direction of the lead). Further, the lower leads 22 and the upper leads 32 are bonded together through the joint parts 25 formed in the step portions 22x. In addition, the semiconductor device 3 differs from the semiconductor device 1 in that a second step portion 32y is formed in the upper face of each of the upper leads 32 near the outer end thereof (i.e., the end farther away from the chip mount section 21 in the longitudinal direction of the lead). The second joint part 35 formed in the second step portion 32y also serves to bond the lower leads 22 and the upper leads 32 together. The second step portion 32y is covered with the resin part 60.

The second joint part 35 may be formed by laser welding similarly to the joint part 25. In FIGS. 9A through 9C, the second joint part 35 is illustrated, as a portion distinct from the upper leads 32. However, the second joint part 35 is merely a portion of the upper leads 32 that is locally melted, and has the same material as, and is continuous with, the upper leads 32.

In the manner as described above, the lower leads 22 and the upper leads 32 are bonded together through the joint part 25 situated close to the inner end (i.e., the end closer to the chip mount section 21 in the longitudinal direction of the lead) and also through the second joint part 35 situated close to the outer end (i.e., the end farther away from the chip mount section 21 in the longitudinal direction of the lead). This arrangement enables sturdy bonding between the lower leads 22 and the upper leads 32 at the points close to the perimeter lateral faces of the semiconductor device 3. This arrangement thus effectively suppresses the risk of having water or the like intruding into the interface between the lower leads 22 and the upper leads 32 from the side exposed to the perimeter lateral faces of the semiconductor device 3.

Further, the thickness of the part that is subjected to laser welding for the purpose of forming the second joint part 35 is thinner than in the case of the semiconductor device 2 illustrated in FIGS. 8A through 8C (because the second joint part 35 is formed in the second step portion 32y), which enables efficient local heating to shorten the process step of laser welding. Other advantages are the same as or similar to those of the first embodiment.

<Fourth Embodiment>

The fourth embodiment is directed to an example in which two step portions are formed in a given lower lead. In connection with the fourth embodiment, a description of the same or similar constituent elements as those of the previously provided descriptions may be omitted as appropriate.

Figure 10A:
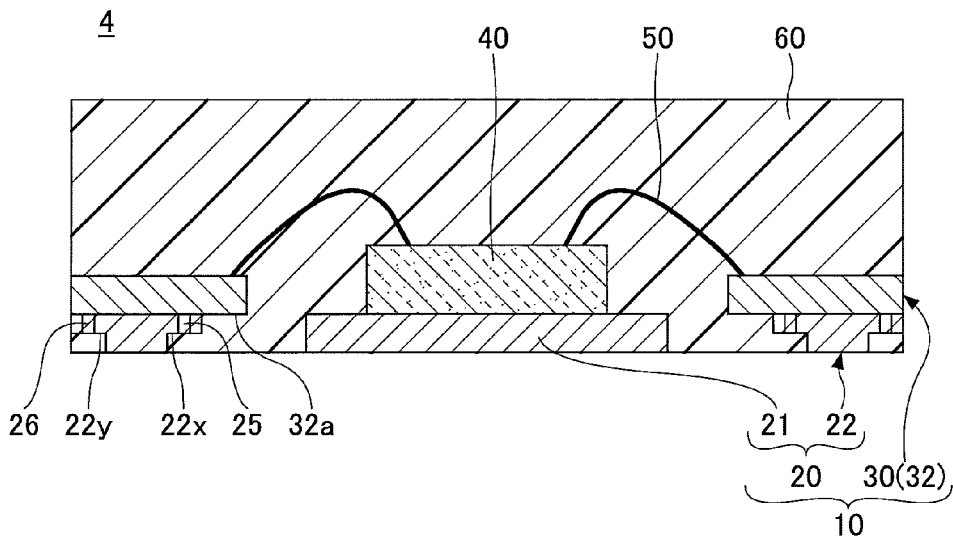
FIGS. 10A and 10B are drawings illustrating an example of a semiconductor device according to a fourth embodiment.
Figure 10B:
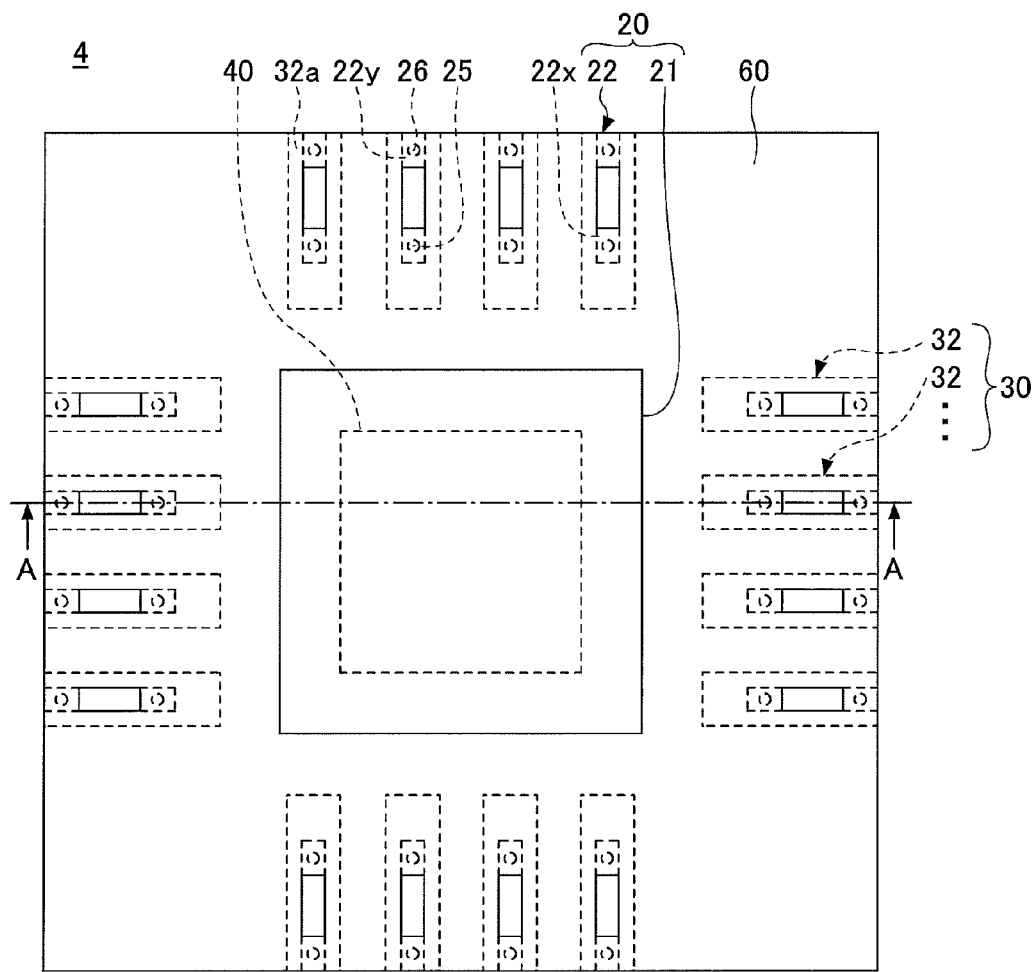
Figure 11A:
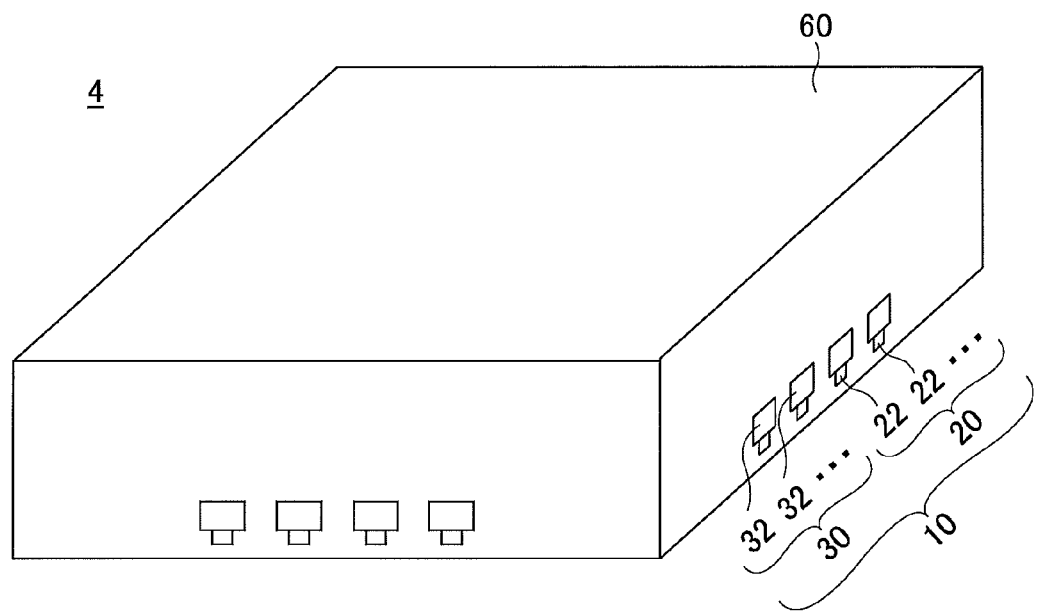
FIGS. 11A through 11C are drawings illustrating the example of the semiconductor device according to the fourth embodiment.
Figure 11B:
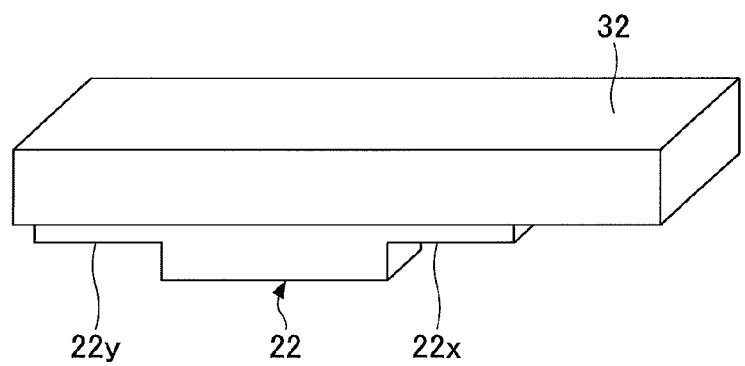
Figure 11C:
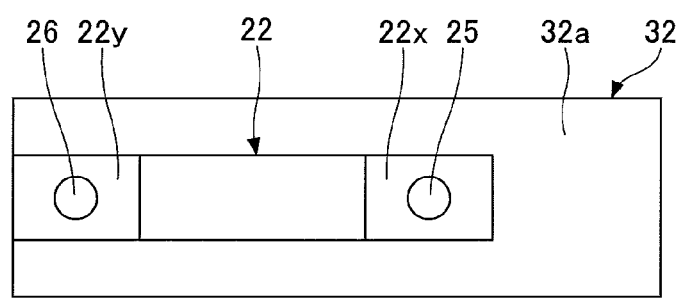

FIGS. 10A and 10B are drawings illustrating an example of a semiconductor device according to the fourth embodiment. FIG. 10B illustrates a bottom plan view, and FIG. 10A illustrates a cross-sectional view taken along a line A-A in FIG. 10B. FIGS. 11A through 11C are drawings illustrating an example of the semiconductor device according to the fourth embodiment. FIG. 11A is a perspective view illustrating the entirety of the semiconductor device. FIG. 11B is a perspective view illustrating an upper lead and a lower lead. FIG. 11C is a bottom plan view illustrating the upper lead and the lower lead.

By referring to FIGS. 10A and 10B as well as FIGS. 11A through 11C, a semiconductor device 4 is configured like the semiconductor device 1 such that the lower face of each of the lower leads 22 has a step portion 22x formed at the inner end (i.e., situated at the end closer to the chip mount section in the longitudinal direction of the lead). Further, the lower leads 22 and the upper leads 32 are bonded together through the joint parts 25 formed in the step portions 22x. In addition, the semiconductor device 4 differs from the semiconductor device 1 in that a third step portion 22y is formed in the lower face of each of the lower leads 22 near the outer end thereof (i.e., the end farther away from the chip mount section 21 in the longitudinal direction of the lead). The third joint part 26 formed in the third step portion 22y also serves to bond the lower leads 22 and the upper leads 32 together. The third step portion 22y is covered with the resin part 60.

The third joint part 26 may be formed by laser welding similarly to the joint part 25. In FIGS. 10A and 10B and FIGS. 11A through 11C, the third joint part 26 is illustrated as a portion distinct from the lower leads 22. Nonetheless, the third joint part 26 is simply a portion of the lower leads 22 that is locally melted, and is made of the same material and continuous with the lower leads 22.

In the manner as described above, the lower leads 22 and the upper leads 32 are bonded together through the joint part 25 situated close to the inner end (i.e., the end closer to the chip mount section 21 in the longitudinal direction of the lead) and also through the third joint part 26 situated close to the outer end (i.e., the end farther away from the chip mount section 21 in the longitudinal direction of the lead). This arrangement enables sturdy bonding between the lower leads 22 and the upper leads 32 at the points close to the perimeter lateral faces of the semiconductor device 4. This arrangement thus effectively suppresses the risk of having water or the like intruding into the interface between the lower leads 22 and the upper leads 32 from the side exposed to the perimeter lateral faces of the semiconductor device 4.

Further, the third step portion 22y formed in the lower leads 22 is covered with the resin part 60 and is thus not exposed to the outside of the semiconductor device 4. Namely, the resin material of the resin part 60 also holds the third step portion 22y, which provides an anchoring function also between the third step portion 22y and the resin part 60, thereby providing yet stronger adhesion between the terminals and the resin part 60. Separation of resin constituting the resin part 60 and disconnection of the lower leads 22 are thus prevented.

Further, the thickness of the part that is subjected to laser welding for the purpose of forming the third joint part 26 is thin (because the third joint part 26 is formed in the third step portion 22y), which enables efficient local heating to shorten the process step of laser welding. Other advantages are the same as or similar to those of the first embodiment.

<Fifth Embodiment>

The fifth embodiment is directed to an example in which no step portion is formed in the lower leads. In connection with the fifth embodiment, a description of the same or similar constituent elements as those of the previously provided descriptions may be omitted as appropriate.

Figure 12A:
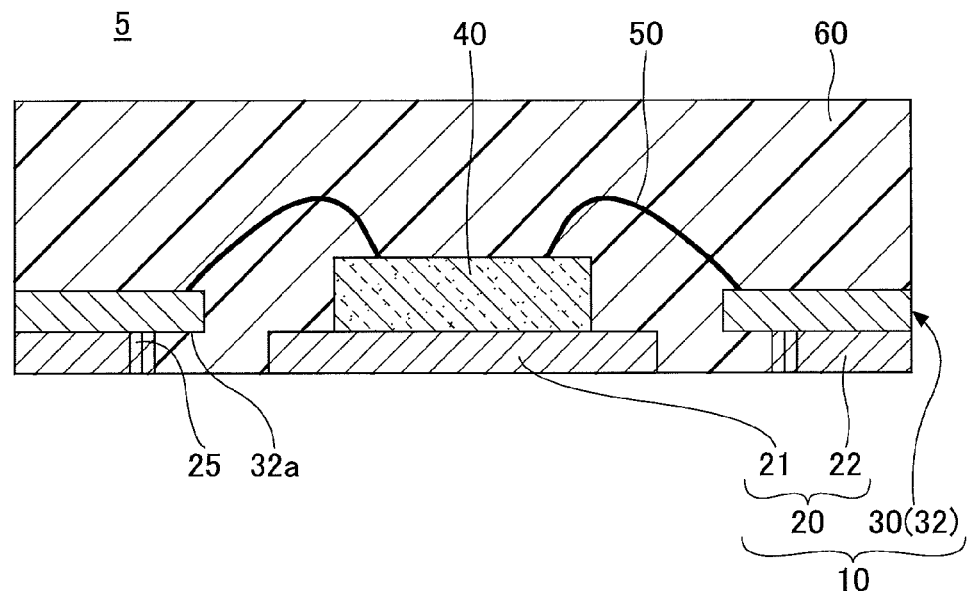
FIGS. 12A through 12C are drawings illustrating an example of a semiconductor device according to a fifth embodiment.
Figure 12B:
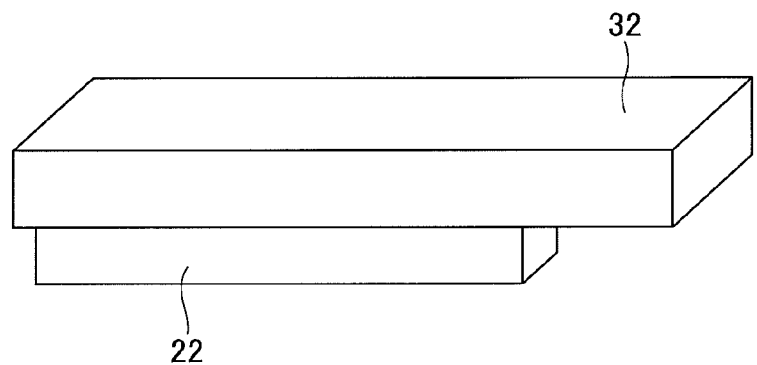
Figure 12C:
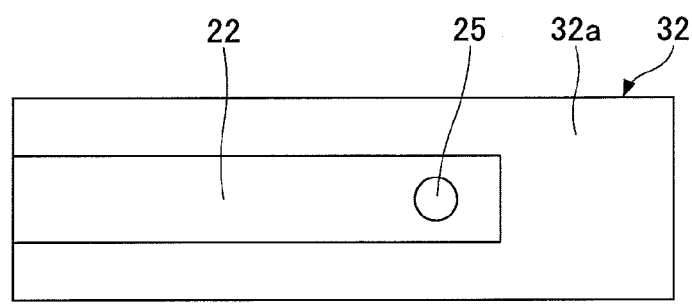

FIGS. 12A through 12C are drawings illustrating an example of a semiconductor device according to the fifth embodiment. FIG. 12A is a cross-sectional view illustrating the entirety of the semiconductor device. FIG. 12B is a perspective view illustrating an upper lead and a lower lead. FIG. 12C is a bottom plan view illustrating the upper lead and the lower lead.

By referring to FIGS. 12A through 12C, the semiconductor device 5 differs from the semiconductor device 1 in that no step portion is formed in the lower leads 22. The lower leads 22 and the upper leads 32 are bonded together through the joint part 25 that is formed in each of the lower leads 22 at the inner end thereof (i.e., the end closer to the chip mount section 21 in the longitudinal direction of the lead).

As in the manner described above, the lower leads 22 and the upper leads 32 may be bonded together through the joint part 25 that is formed in each of the lower leads 22 at the inner end thereof (i.e., the end closer to the chip mount section 21 in the longitudinal direction of the lead), without forming the step portion 22x in the lower leads 22. In this case also, the lower face of a given upper lead 32 of a terminal extends further to expose the periphery portion 32a around a lower lead 22. With this arrangement, the resin material of the resin part 60 holds the periphery portion 32a, which provides an anchoring function between the periphery portion 32a and the resin part 60, thereby providing strong adhesion between the terminals and the resin part 60. Separation of resin constituting the resin part 60 and disconnection of terminals are thus prevented.

In place of half etching that tends to be performed with low precision, a press process that enables a high precision process at low cost is used to produce the lower leads 22 and the upper leads 32 separately from each other, followed by laminating the lower leads 22 and the upper leads 32 together to form the terminals. This arrangement enables the miniaturization of terminals, thereby achieving shorter pitches and an increased number of terminals. Process cost is also reduced compared with the case in which half etching is used.

Use of different metal materials for the lower leads 22 and the upper leads 32 may provide advantages utilizing the characteristic properties of different metal materials. For example, use of copper (Cu) for the lower leads 22 enables the use of solder plating, and use of aluminum (Al) for the upper leads 32 allows the areas for wire bonding to require no plating.

<Sixth Embodiment>

The sixth embodiment is directed to an example in which a step portion is formed in the chip mount section. In connection with the sixth embodiment, a description of the same or similar constituent elements as those of the previously provided descriptions may be omitted as appropriate.

Figure 13:
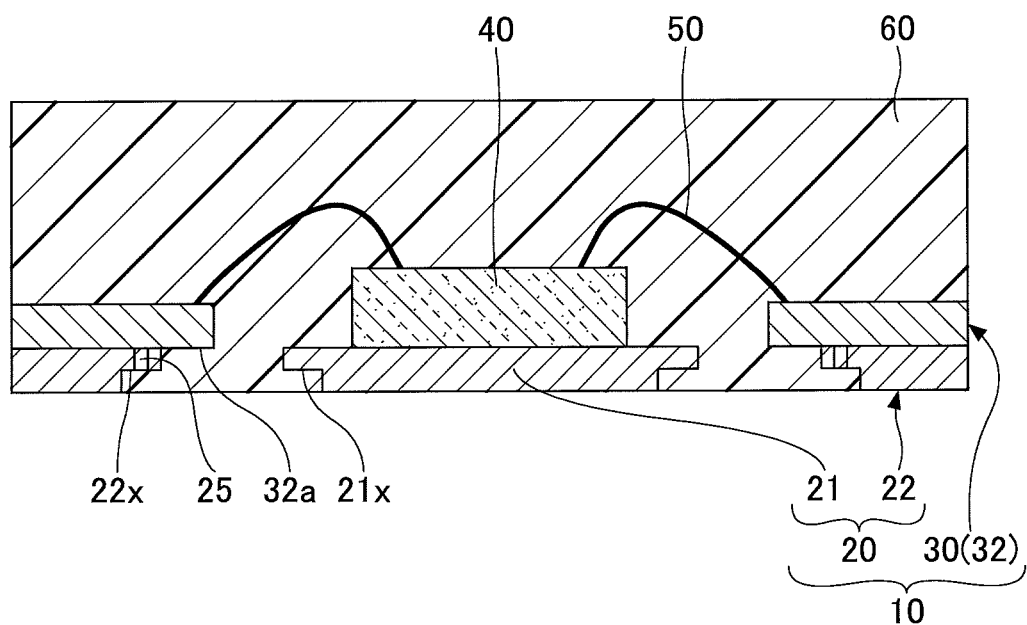
FIG. 13 is a cross-sectional view illustrating an example of a semiconductor device according to a sixth embodiment.

FIG. 13 is a cross-sectional view illustrating an example of a semiconductor device according to the sixth embodiment. By referring to FIG. 13, the semiconductor device 6 differs from the semiconductor device 1 in that a fourth step portion 21x is formed along the perimeter of the lower face of the chip mount section 21. The fourth step portion 21x may have a frame shape formed along the perimeter of the lower face of the chip mount section 21, for example.

As described above, the lower face of the chip mount section 21 may have the fourth step portion 21x formed along the perimeter thereof. With this arrangement, the resin material of the resin part 60 holds the fourth step portion 21x, which provides an anchoring function between the fourth step portion 21x and the resin part 60, thereby providing strong adhesion between the chip mount section 21 and the resin part 60. Separation of resin constituting the resin part 60 and disconnection of the chip mount section 21 are thus prevented. Other advantages are the same as or similar to those of the first embodiment.

Further, the present invention is not limited to these embodiments and variations, but various variations and modifications may be made without departing from the scope of the present invention.

For example, the embodiments and variation described above have been directed to an example in which the first frame 20 includes the chip mount section (i.e., die pad). Alternatively, the second frame 30 may include the chip mount section. Alternatively, both the first frame 20 and the second frame 30 may have chip mount sections, respectively, which may be laminated and welded together.

Moreover, the chip mount section (i.e., die pad) may not be exposed from the resin part 60.

Further, the position of the joint part is not limited to the inner end or to the outer end, and the joint part may be formed at any position. Similarly, the step portion may be formed at any position.

It may further be noted that the disclosed embodiments and variations may be combined as appropriate.

According to at least one embodiment, a semiconductor device is provided that has improved adhesion between terminals and a resin part.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device, comprising:
a lead frame having terminals;
a semiconductor chip electrically coupled to the terminals; and
a resin part configured to encapsulate the semiconductor chip such as to expose part of the terminals,
wherein a given one of the terminals includes a first lead and a second lead welded together such that an upper face of the first lead is placed against a lower face of the second lead,
wherein the lower face of the second lead extends further than the upper face of the first lead toward the semiconductor chip in a longitudinal direction of the given one of the terminals, and also extends further sideways than the upper face of the first lead in a transverse direction of the given one of the terminals, and wherein an area of the lower face of the second lead is covered with the resin part, the area extending further than the upper face of the first lead, wherein a lower face of the first lead has a step portion formed at a position toward the semiconductor chip, and the step portion has a joint part formed therein by welding for connection with the second lead, the step portion being covered with the resin part, and wherein a thickness of the step portion of the first lead is less than a thickness of a remaining portion of the first lead, and the upper face of the first lead is fully covered with the second lead.

2. The semiconductor device as claimed in claim 1, wherein the second lead has a second joint part formed therein by welding for connection with the first lead at a side opposite from a side situated toward the semiconductor chip.

3. The semiconductor device as claimed in claim 2, wherein an upper face of the second lead has a second step portion formed at the side opposite from the side situated toward the semiconductor chip, and the second step portion has the second joint part formed therein, the second step portion being covered with the resin part.

4. The semiconductor device as claimed in claim 1, wherein the lower face of the first lead has a third step portion formed at a side opposite from a side situated toward the semiconductor chip, and the third step portion has a third joint part formed therein by welding for connection with the second lead, the third step portion being covered with the resin part.

5. A lead frame, comprising a plurality of areas to be separated into discrete pieces, wherein a given one of the areas includes terminals, and a given one of the terminals includes a first lead and a second lead welded together such that an upper face of the first lead is placed against a lower face of the second lead, and wherein the lower face of the second lead extends further than the upper face of the first lead toward a center of the given one of the areas in a longitudinal direction of the given one of the terminals, and also extends further sideways than the upper face of the first lead in a transverse direction of the given one of the terminals, wherein a lower face of the first lead has a step portion formed at a position toward the center, and the step portion has a joint part formed therein by welding for connection with the second lead, and wherein a thickness of the step portion of the first lead is less than a thickness of a remaining portion of the first lead, and the upper face of the first lead is fully covered with the second lead.

6. The lead frame as claimed in claim 5, wherein the second lead has a second joint part formed therein by welding for connection with the first lead at a side opposite from a side situated toward the center.

7. The lead frame as claimed in claim 6, wherein an upper face of the second lead has a second step portion formed at the side opposite from the side situated toward the center, and the second step portion has the second joint part formed therein.

8. The lead frame as claimed in claim 5, wherein the lower face of the first lead has a third step portion formed at a side opposite from a side situated toward the center, and the third step portion has a third joint part formed therein by welding for connection with the second lead.

* * * * *